United States Patent
Pardoe

(10) Patent No.: US 11,723,149 B2
(45) Date of Patent: Aug. 8, 2023

(54) RESISTIVE PCB TRACES FOR IMPROVED STABILITY

(71) Applicant: Kioxia Corporation, Minato (JP)

(72) Inventor: Stephen Pardoe, Wiltshire (GB)

(73) Assignee: Kioxia Corporation, Tokyo (JP)

( * ) Notice: Subject to any disclaimer, the term of this patent is extended or adjusted under 35 U.S.C. 154(b) by 86 days.

(21) Appl. No.: 17/158,164

(22) Filed: Jan. 26, 2021

(65) Prior Publication Data

US 2021/0153353 A1     May 20, 2021

Related U.S. Application Data

(63) Continuation of application No. 16/834,309, filed on Mar. 30, 2020, now Pat. No. 10,912,199.

(60) Provisional application No. 62/909,921, filed on Oct. 3, 2019.

(51) Int. Cl.
| | |
|---|---|
| H05K 1/16 | (2006.01) |
| H05K 1/11 | (2006.01) |
| H05K 3/04 | (2006.01) |
| H05K 3/40 | (2006.01) |

(52) U.S. Cl.
CPC ............ H05K 1/162 (2013.01); H05K 1/115 (2013.01); H05K 3/04 (2013.01); H05K 3/4038 (2013.01); *H05K 2201/09227* (2013.01); *H05K 2201/09236* (2013.01); *H05K 2203/0228* (2013.01)

(58) Field of Classification Search
CPC ........ H05K 1/167; H05K 1/115; H05K 1/162; H05K 1/181; H05K 1/0243; H05K 1/025; H05K 1/0251; H05K 1/0253; H05K 3/4038
See application file for complete search history.

(56) References Cited

U.S. PATENT DOCUMENTS

| | | | |
|---|---|---|---|
| 4,985,808 A | * | 1/1991 | Zernov ............... H05K 1/0293 338/334 |
| 6,992,387 B2 | | 1/2006 | Hester et al. |
| 2001/0033203 A1 | | 10/2001 | Goma et al. |

(Continued)

FOREIGN PATENT DOCUMENTS

| | | |
|---|---|---|
| DE | 17 94 780 U | 9/1959 |
| DE | 10 2017 223647 A1 | 6/2019 |
| JP | 6338784 B1 | 6/2018 |

*Primary Examiner* — Hoa C Nguyen
*Assistant Examiner* — Amol H Patel
(74) *Attorney, Agent, or Firm* — Allen & Overy LLP

(57) ABSTRACT

A method of running a printed circuit board (PCB) trace on a PCB. The PCB comprising a plurality of PCB layers. The method comprising forming a conductive trace on at least one of the plurality of PCB layers; coupling a first portion of the conductive trace to a capacitor formed on at least one of the plurality of PCB layers; coupling a second portion, different from the first portion, of the conductive trace to a conductive material formed within a first via extending through two or more of the plurality of PCB layers; and configurably setting a length of a conductive path of the conductive trace according to a predetermined impedance. The capacitor is separated laterally in a plan view at a first distance from the first via. The length of the conductive trace in the plan view is greater than the first distance. The conductive path of the conductive trace of the length has the predetermined impedance.

16 Claims, 5 Drawing Sheets

(56) References Cited

U.S. PATENT DOCUMENTS

| | | |
|---|---|---|
| 2001/0035799 A1 | 11/2001 | Ueno et al. |
| 2003/0034855 A1 | 2/2003 | Wallace et al. |
| 2008/0048824 A1* | 2/2008 | Nakayama ............. H05K 1/167 |
| | | 338/195 |
| 2009/0049414 A1 | 2/2009 | Mutnury et al. |
| 2015/0357760 A1 | 12/2015 | Aihara et al. |
| 2016/0183386 A1 | 6/2016 | Song et al. |
| 2019/0372542 A1 | 12/2019 | Kobayashi et al. |

* cited by examiner

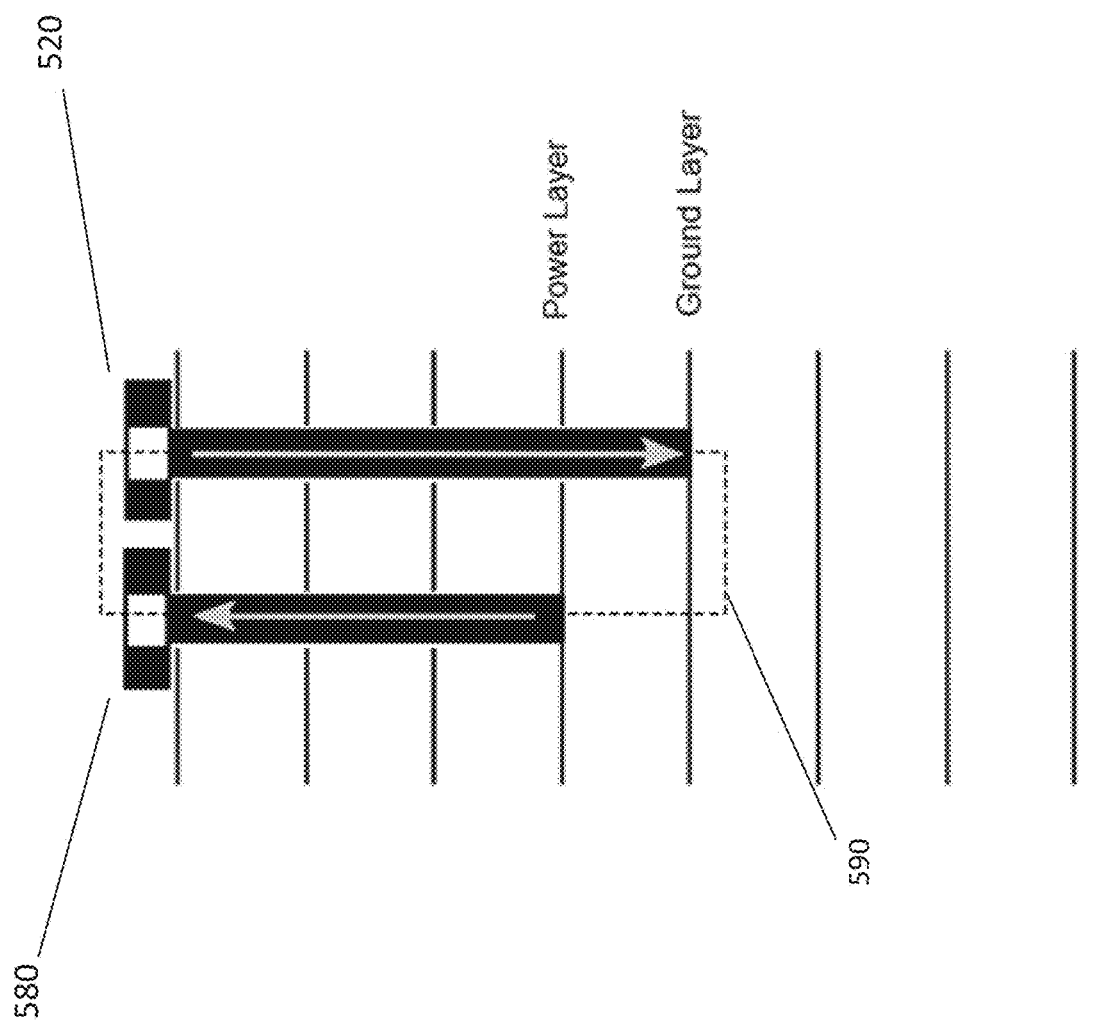

RESISTIVE PCB TRACES FOR IMPROVED STABILITY

CROSS-REFERENCE TO RELATED APPLICATIONS

This application is a continuation of application Ser. No. 16/834,309 filed Mar. 30, 2020, which is based upon and claims the benefit of priority from U.S. Provisional Application No. 62/909,921, filed on Oct. 3, 2019; the entire contents of which are incorporated herein by reference.

FIELD OF THE INVENTION

This invention generally relates the use of resistive printed circuit board (PCB) traces to improve integrated circuit performance, stability, and manufacture.

BACKGROUND OF THE INVENTION

As integrated circuits decrease in size and increase in complexity, new problems emerge in high frequency circuits.

Power supply networks for integrated circuits have an associated impedance. As circuits evolve, there is an increased need for low impedance and a need for wider frequency ranges in order for integrated circuits to operate faster and for faster data rates. However, modern ceramic capacitors can be unstable when used as a decoupling or bypass capacitor if an integrated circuit has an inductance which resonates with the capacitor.

One alternative is to use tantalum capacitors. However, the material needed to produce such capacitors comes from unstable regions. Accordingly, for both social and economic reasons, the use of tantalum capacitors is undesirable.

Another approach is to use resistors to dampen the resonance of the ceramic capacitors, thereby reducing the impedance peaks of the integrated circuit. However, recently there have been worldwide shortages of resistors, which has had the effect of increasing lead times and prices.

Thus, there is an unmet need for a solution that avoids the use tantalum capacitors without resorting to the use of resistors.

BRIEF DESCRIPTION OF THE INVENTION

Certain aspects of the present invention are directed to a method of running a PCB trace on a PCB. The PCB comprising a plurality of PCB layers. The method comprising forming a conductive trace on at least one of the plurality of PCB layers; coupling a first portion of the conductive trace to a capacitor formed on at least one of the plurality of PCB layers; coupling a second portion, different from the first portion, of the conductive trace to a conductive material formed within a first via extending through two or more of the plurality of PCB layers; and configurably setting a length of a conductive path of the conductive trace according to a predetermined impedance. The capacitor is separated laterally in a plan view at a first distance from the first via. The length of the conductive trace in the plan view is greater than the first distance. The conductive path of the conductive trace of the length has the predetermined impedance.

According to certain embodiments of the present invention, the method further includes, selectively cutting at least one of a plurality of trace segments to form the conductive path of the conductive trace having the length.

According to other embodiments of the present invention, the method further includes forming two or more of the plurality of trace segments parallel to each other in the plan view in a first region and a second region. A first lateral distance between the two or more plurality of trace segments in the first region is greater than a second lateral distance between the two or more plurality of trace segments in the second region.

According to yet other embodiments of the present invention, the method further includes, selectively electrically connecting two or more of a plurality of disconnected trace segments to form the conductive path of the conductive trace having the length.

In certain other embodiments, the method further includes, forming two or more of the plurality of disconnected trace segments parallel to each other in a first region and a second region, wherein a first lateral distance between the two or more plurality of disconnected trace segments in the first region is greater than a second lateral distance between the two or more plurality of disconnected trace segments in the second region.

According to some embodiments of the present invention, the method further includes, electrically connecting two or more locations on the conductive trace with a bridge, wherein the length of the conductive path of the conductive trace includes a length of the bridge.

According to certain other embodiments of the present invention, the method further includes, cutting a portion of the conductive trace.

According to yet other embodiments of the present invention, the method further includes, forming a second via extending through two or more of the plurality of PCB layers, wherein, when current flows through the first via and the second via, the first via has a first electrical field with a first polarity and the second via has a second electrical field with a second polarity opposite the first polarity, such that the electrical first electrical field and the second electrical field cancel each other out.

According to some embodiments of the present invention, the method also includes, forming a second via extending through two or more of the plurality of PCB layers between 0.2 m and 4 mm from the first via in a plan view.

BRIEF DESCRIPTION OF THE FIGURES

FIG. 5 shows the close proximity positioning of power and ground vias in accordance with certain aspects of the present invention.

DETAILED DESCRIPTION OF THE INVENTION

Figure 1:
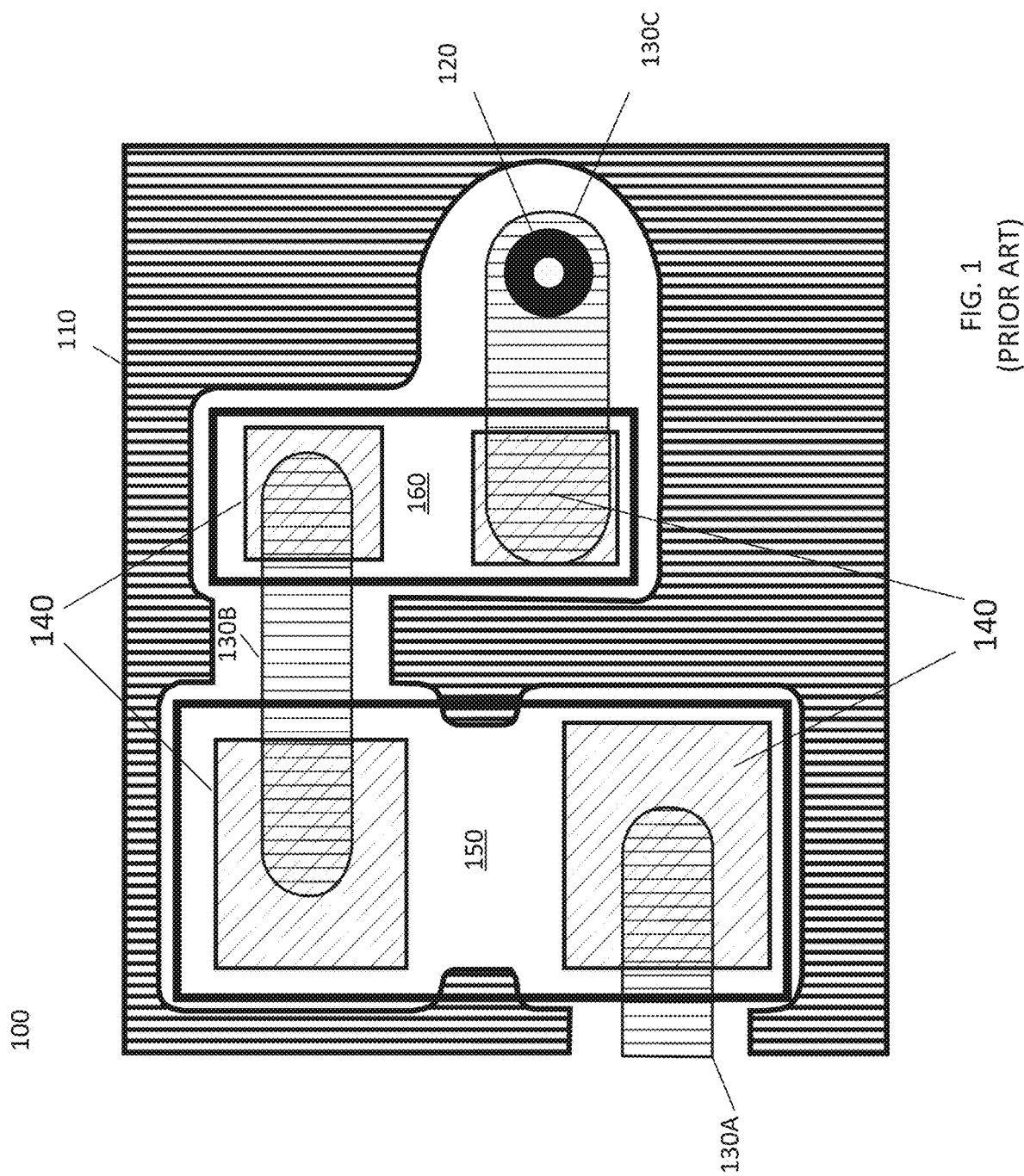
FIG. 1 is a block diagram of a portion of a circuit on a PCB in accordance with certain prior art approaches.

FIG. 1 illustrates certain prior art approaches for designing a portion of an power circuit on printed circuit board (PCB) 100 supplying power to an integrated circuit (not shown). A large portion of PCB 100 is the ground plane 110. Some advantages of a large ground plane is to make circuit layout easier, allowing the designer to ground any component without having to run additional traces. Ground plane 110 does not have to be exclusively on the surface of PCB 100, or even on the surface at all. One possibility is that ground plane 110 is in, or partially in, a separate layer of PCB 100. A person of ordinary skill in the art would appreciate that different configurations and placements of the ground plane 110 are possible.

In cases of multilayer PCBs, such as PCB 100, where the ground plane can also occupy a specific layer of the PCB, via 120 serves as a grounding pointing to the lower ground plane layer. This allows traces such as trace 130c to connect to a centralized ground point.

The ground plane 110 conducts the large return currents from many components without significant voltage drops, ensuring that the ground connection of all the components are at the same reference potential. In case of PCB 100, the return point, for example a power via, not illustrated, would connect the circuit to a power plane to complete the circuit. However, it may be difficult to place the ground and power points close to each other because of the space required by components such as capacitor 150 and resistor 160. This partially to do with the size of capacitor 150 and resistor 160. However, real estate demand also has to account for multiple mounting pads 140, and traces 130B and 130A, which connect these components to others within the greater circuit including the integrated circuit. The longer the return path, the higher the risk of crosstalk because a longer return path creates a large inductive field, which can interfere with signals on the PCB 100. Crosstalk and signal degradation risk increases with longer return paths at least in part because there is a large risk that the path will run closes to another path such that their magnetic/inductive fields can cause unwanted voltage/signals (i.e. noise) to be induced onto one path by the current flowing in another due to magnetic or capacitive coupling.

For example, where resistor 160 is a 0402 imperial resistor (1005 metric resistor) this is not an insignificant amount of real estate. Specifically, even in a design which attempts to reduce minimize the real state impact, resistor 160, its associated pads 140, and its dedicated traces 130B (connecting the resistor 160 to capacitor 150) and 130C (connecting resistor 160 to the ground via 120) can take up 2.42 square millimeters of space. With the ever-shrinking size of integrated circuits, this can be a significant amount of space.

This does not take into account that resistor 160 also takes up about 0.35 millimeters of vertical space (not accounting for the pads 140). In addition to taking up vertical space, the presence of resistor 160 requires that current on the integrated circuit be pulled up and then pushed down to flow through resistor 160 which sits above the surface of PCB 100. As the current is moved through the resistor 160, it is effectively lifted off the surface of PCB 100. This increases the length of the return path. As mentioned above, this can lead to crosstalk and signal degradation.

However, in traditional designs, resistor 160 is needed to dampen the resonance of capacitor 150 in order to reduce the magnitude of impedance peaks which are undesirable in modern high frequency low impedance integrated circuits.

Figure 2:
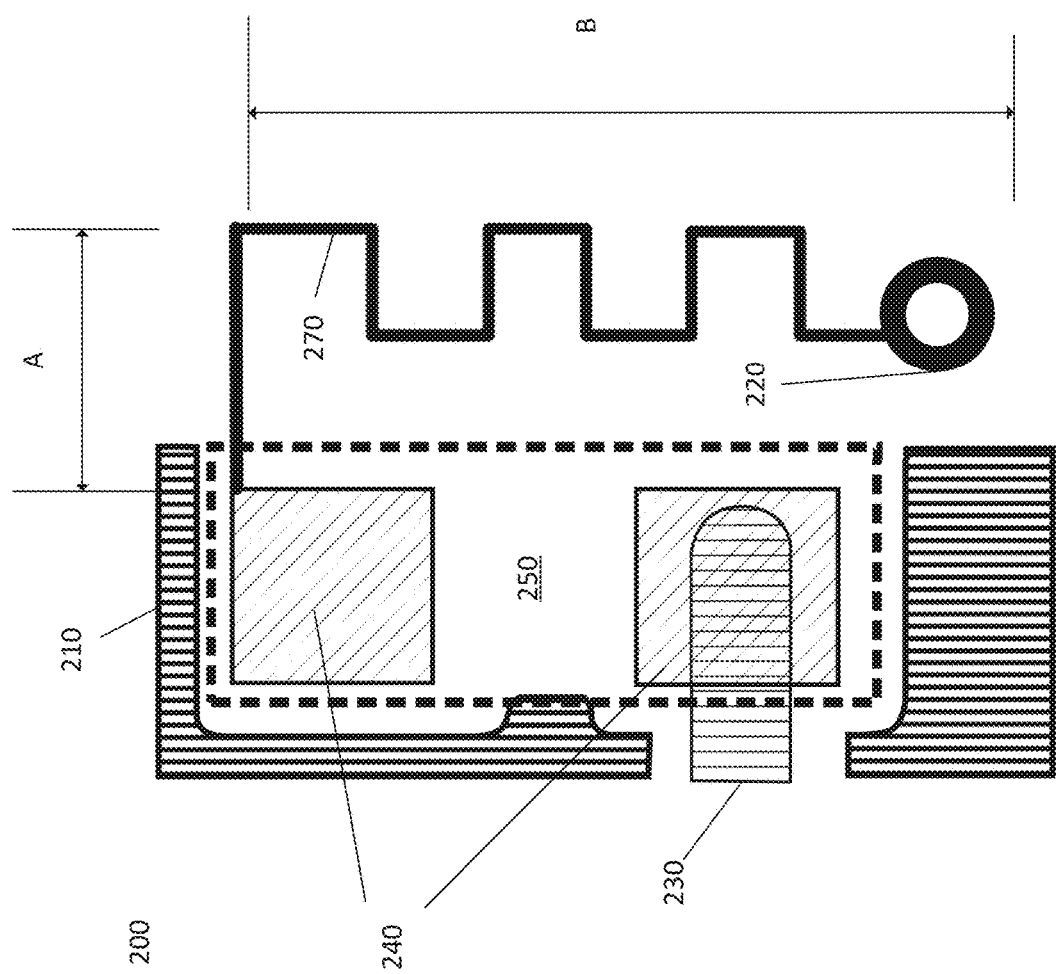
FIG. 2 shows a portion of one circuit configuration in accordance with certain embodiments of the present invention.

FIG. 2 illustrates an approach to designing a similar portion of an integrated circuit on PCB 200 in accordance with certain embodiments describes herein. Like the portion of the integrated circuit illustrated in FIG. 1, the integrated circuit of FIG. 2 is implemented on a PCB 200 with a ground plane 210. Additionally, the integrated circuit of FIG. 2 also has a capacitor 250, connected to the PCB 200 using pads 240, and to other components such as an integrated circuit using trace 230.

However, unlike the circuit of FIG. 1, there is no physical surface mount resistor or associated pads. Rather, the capacitor is connected to ground via 220 directly by trace 270. PCB trace 270 is illustrated differently from trace 230 for ease of understanding. However, a person ordinary skill in the art would understand that a number of materials and approaches can be used to implement traces on a PCB and the traces 230 and 270 could be similar or entirely different depending on the needs of the integrated circuit design.

PCB trace 270 is designed to have a length to produce an equivalent series resistance (ESR) akin to that of the resistor 140. The needed length can vary depending on the width of the PCB trace 270. The width of PCB trace 270 can vary with process used to manufacture the trace wire or the need to dampen the resonance form by capacitor 250 and the inductance of the integrated circuit pin (not shown) connected to trace 230. For example, typical production processes are able to easily produce 80 micrometer wide PCB traces. More advance processes are capable making PCB trace with a width of 50 micrometers. A person ordinary skill in the art would understand that these are only examples and it is possible to produce PCB traces having any number of widths as needed.

To conserve real estate, PCB trace 270 can have a number of patterns, such as the "zig-zag" pattern illustrated in FIG. 2. Various patterns can be implemented to achieve a desired ESR while positioning capacitor 250 in close proximity of ground via 220. The overall length of PCB trace 270 will generally be longer than the distance between capacitor 250 and ground via 220 in order to achieve maximum spacing savings.

An appropriate design is selected to match ESR needs of the integrated circuit such that PCB trace 270 can produce sufficient ESR to dampen the resonance of capacitor 250 and the inductance of the integrated circuit pin (not shown) connected to trace 230. This eliminates the need for a separate resistor, as well as the additional items, such as pads and other traces needed to connect a separate resistor to the integrated circuit. This allows for circuits with smaller footprints while reducing costs.

The space savings can be significant. For example, a PCB trace 270 and ground via 220 can occupy an area with a width A of 0.4 millimeters and a length B of only 2.5 millimeters to achieve the same ESR as that of a 0402 imperial resistor. That is, the ESR effect can be achieve by taking up only 1 square millimeter compared with the over 2 square millimeters needed when using a resistor with a comparable ESR. This is a significant reduction in real estate all while eliminating a resistor at the same time.

Figure 3C:
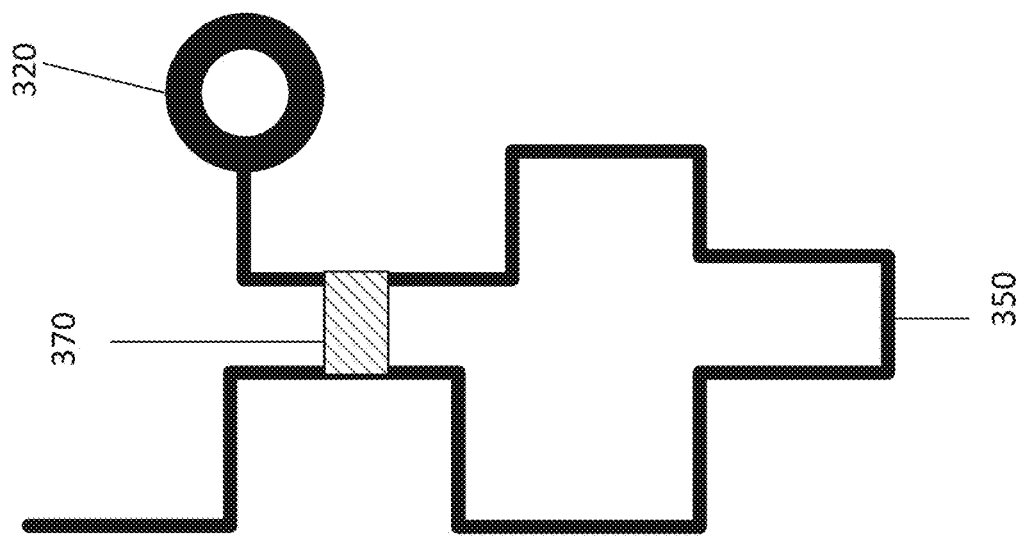
FIG. 3C shows yet another possible PCB trace design in accordance with certain embodiments of the present invention.

It certain instances, the required ESR is known in advance, for example where the PCB will only for a specific integrated circuit. For such cases, FIG. 3A illustrates a fixed PCB trace 310 connected to ground via 320. Although a fixed PCB trace 310 has only one possible length and ESR value, it is cheaper and simpler to produce.

However, there are many cases where fixed PCB trace 310 is insufficient. For example, when testing to determine the appropriate length of a PCB trace for a particular ESR value or where a PCB can be used for different circuit designs, the exact required ESR might not be known prior to PCB manufacture. In such instances, it may be beneficial to implement a flexible PCB trace design.

Figure 3B:
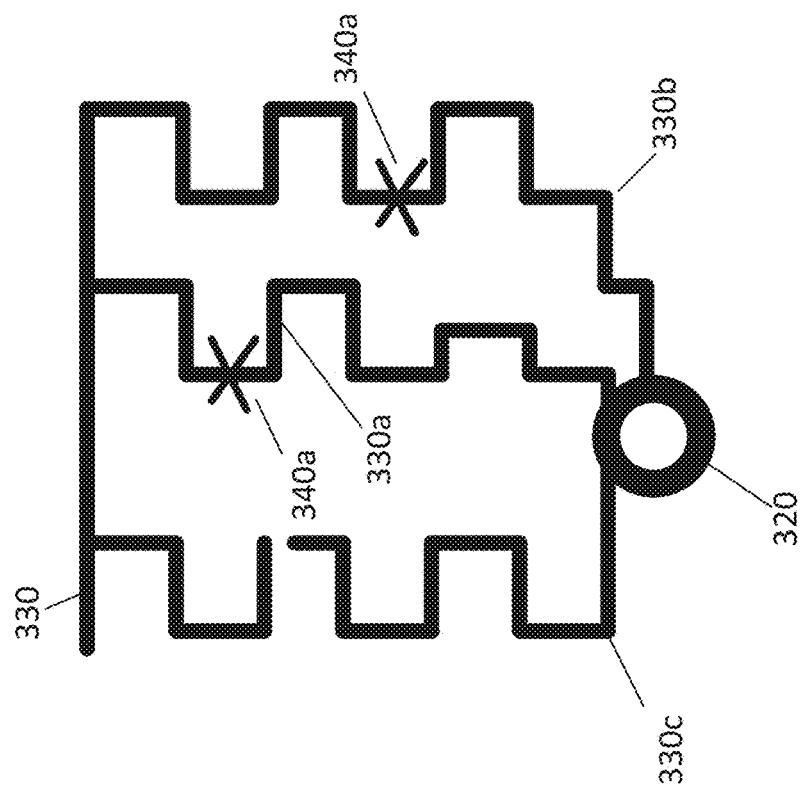
FIG. 3B shows another possible PCB trace design in accordance with certain embodiments of the present invention.
Figure 3A:
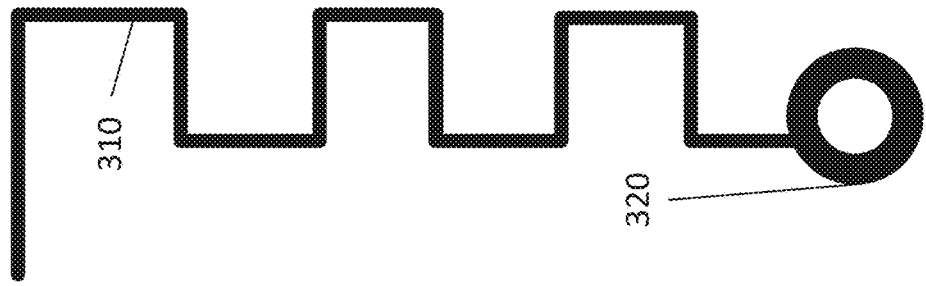
FIG. 3A shows one possible PCB trace design in accordance with certain embodiments of the present invention.

One example of a flexible PCB trace design is illustrated in FIG. 3B. PCB trace 330 had two branches 330a and 330b, as well as a disconnected branch 330c. The final impedance of PCB trace 330 is not fixed. Rather, depending on the needs of the configuration of the circuit ESR value to dampen the resonance of the circuit formed by a bypass/decoupling capacitor (not shown) and the inductance presented by a power supply pin of an integrated circuit (not shown), different final lengths of PCB trace 330 can be set. This can be done using a number of methods. Additionally, while many of the PCB traces throughout the application are illustrated as straight lines or a combination or straight lines and 90 degree angles, this is not required. PCB traces can be run with curves or any number of angles. A person of ordinary skill in the art would understand that there are a number of ways to run a PCB trace.

Branches 330a and 330b can cut at cut points 340a and 340b which will modify the impedance of the trace 330, where traces 330a, 330b and 330c are equivalent to resistors in parallel. Cutting the trace will break the circuit on that branch and prevent current flow down that branch. The remaining uncut branch will form the final length and determine the impedance of PCB trace 330 through which the current flows to ground via 320. Cut points 340a and 340b are shown for illustrative purpose, but a person of ordinary skill in the art would understand that PCB trace 330, or any PCB trace, formed by separate traces 330a, 330b and 330c in parallel, can have a variable number of the constituent traces 340a, 340b and 340c with a cut and the cut points are not exclusively tied to fixed or predetermined points along the PCB trace 330. In some implementations, traces with a cut may be repaired with a solder bridge in order to restore the trace. The position of the cut points may also be chosen in order to minimize any parasitic capacitance or inductance of the traces 330a,b,c. However, certain aspects may make certain portion of PCB trace 330 more suitable for cut points.

For example, it may be beneficial to vary the distance between different branches 330a and 330b and disconnected branch 330c between the capacitor, not illustrated, and ground via 320. Not only can this create certain flexibility in routing and variation in ESR value selection, reduction and/or variation in parasitic capacitance or inductance, but create more advantageous cut points.

Cutting parallel trace branches is not the only way to add variation and flexibility to PCB trace 330. PCB trace 330 can contain disconnected branches, such as disconnected branch 330c. Disconnected branches may be disconnected on one or both ends. Disconnected branch 330c can be reconnected to the PCB trace 330 by soldering the end points to PCB trace 330 or through other techniques that create an electrical connection between the ends of disconnected branch 330c and PCB trace 330. Any number of branches, disconnected branches, or a combination thereof can be used to implement a flexible PCB trace 330.

It is beneficial to route branches 330a and 330b, as well as any disconnected branches, such as disconnected branch 330c, such that each provides a different parallel impedance between ground via 320 and the capacitor in order to provide maximum flexibility in routing and variation in the resulting ESR. However, there may times where having redundant lengths of path may be beneficial. For example, in order to provide a back up in case the wrong branch is cut.

Cutting branches or connecting disconnected branches, it not the only approach to adding flexibility and variation in ESR. Another possible approach is illustrated in FIG. 3C. PCB trace 350 is similar to the fixed PCB trace 310 of FIG. 3A. However, it is design to have portions run close together, for example portions near the connection to the capacitor and portions near to the connection to ground via 320. This allows for a bridge 370 to be formed between these portions, shortening the overall length of the PCB trace 350 through which current flows and thereby reducing the ESR value.

Bridge 370 could be a solder bridge, or by routing a new trace. A person of ordinary skill in the art would understand that there a number of techniques the can be used to bridge different portion of PCB trace 350 to create an electrical connection that shortens the length of the path on which the current flows.

PCB trace 350 can have more than one possible bridging point where bridge 370 is placed. Various bridge points would each result in a different ESR value of PCB trace 350 thereby adding additional flexibility to select the desired ESR value need for a particular integrated circuit design. Additionally, it may be beneficial to additionally cut, or otherwise disconnect the portions of PCB trace 350 that are rendered redundant or out of use by bridge 370.

A person of ordinary skill in the art would understand that there a number of ways to implement flexible PCB traces to achieve the desired ESR value and that the figures are only used to help better understand the concept and are not inclusive of all of the possible designs.

Figure 4:
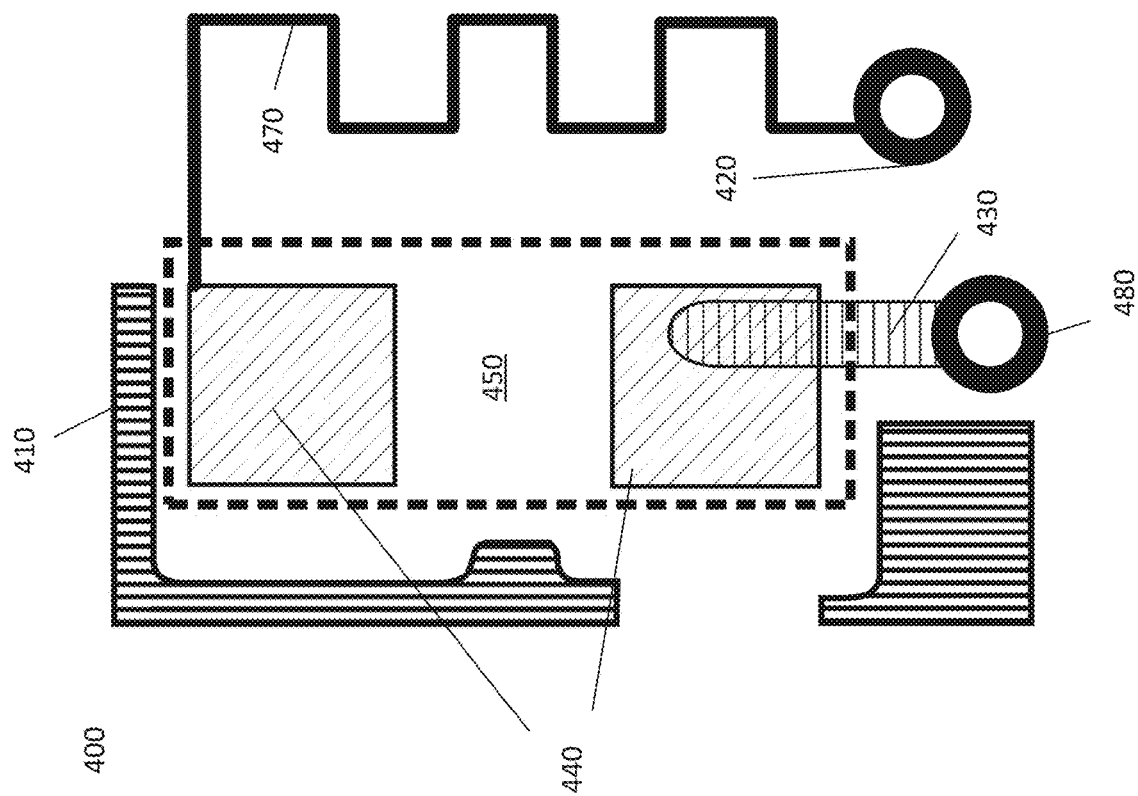
FIG. 4 shows a portion of one integrated circuit configuration in accordance with certain embodiments of the present invention.

Another advantage of using PCB traces to replace resistors in power circuits becomes apparent from considering FIG. 4. FIG. 4 illustrates a portion of an power circuit on PCB 400 with a ground plane 410. The power circuit has a capacitor 450 mounted on pads 440, which connect the capacitor 450 to PCB 400. A trace 430 connects the capacitor 450 to other components of the power circuit, such as the power supply pin of an integrated circuit (not shown).

In accordance with certain aspects of the present invention, PCB trace 470 provides a sufficient ESR value to dampen the resonance of the circuit formed by capacitor 450 and the inductance presented by a power supply pin of an integrated circuit (not shown) and connects the capacitor to ground via 420. Unlike, prior examples, PCB 400 additionally has a power via 480 in close proximity to ground via 420. This possible due to the space saving use of PCB trace 470 and the elimination the resistor that would otherwise be necessary to dampen the resonance of the capacitor.

Placing ground via 420 in close proximity to power via 480 can produce a number of advantageous results. For example, placing ground via 420 close to power via 480 shortens the current return path and reduces the area enclosed by the power supply decoupling circuit formed by capacitor 450 and resistive trace 470. As discussed above, shorter return paths provide better signal integrity than longer return paths due to reduced magnetic/inductive fields and capacitive coupling.

FIG. 5 illustrates placing vias in close proximity with one another on a multilayer PCB in accordance with certain embodiments of the present invention. As described with reference to FIG. 4, replacing a resistor with a PCB trace allows placing different vias, such as power via 580 and ground via 520, in close proximity. This has the immediate advantage of shorting the return path for the current resulting in improved signal reliability. However, other advantages can also be achieved from closely placing power via 580 and ground via 520.

One such advantage is derived from the operation of power via 580 and ground via 520. As part of the return path 590, current is pulled up from the power layer and runs through the components mounted on the surface of a PCB. The current is also push down through ground via 520 to the ground layer. As the current flows along return path 590, both power via 580 and ground via 520 generate an electrical field. However, the electrical fields of power via 580 and ground via 520 will have opposite polarities from one another.

When power via 580 and ground via 520 are placed far apart, the electrical fields may interfere with signals on surrounding traces or interfere with other components of the integrated circuit. One approach to mitigate these risks is to place power via 580 and ground via 520 away from other traces and components at cost of PCB real estate.

However, as the use of PCB traces allows placing power via 580 and ground via 520 in close proximity, power via 580 and ground via 520 can be close enough together for the opposite polarity electrical fields to dampen or cancel each other out. This reduces the risk the electrical fields of power via 580 and ground via 520 will interfere with the operation of the integrated circuit.

In certain embodiments of the present invention, a person of ordinary skill in the art would understand that two vias of opposite polarities should be placed as close possible to each other. For example, in certain embodiments, vias can be placed as close as 0.4 mm apart from each other in a plan view and can be placed as closes as 0.2 mm apart from pads in a plan view. However, a person of ordinary skill in the art will know that the manufacturer, customer, or possibly even manufacturing techniques/techniques will dictate minimum distances for side-by-side via placement. As a result, a person of ordinary skill in the art would understand that the minimum possible distance between vias can vary without departing from the spirit of the invention.

Further, a person of ordinary skill in the art would understand that magnetic field strength is proportional to the current passing through the conductor and inversely proportional to the distance from the conductor. For example, at a distance of 1 mm from the conductor, the field strength is to $\frac{1}{10}$th of the field strength at the conductor. At 2 mm from the conductor, the field strength is 1½oth of the initial field strength at the conductor. In certain embodiments of the present invention, placing the two vias with opposite polarities more than 4 mm apart would exhibit little field cancellation effect.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

Additionally, elements reference through the present invention can be divided into certain sub-elements, combined, or duplicated without departing from the spirit of the invention. Further, some the specific components discussed above, such as capacitors, may be of various sizes and implementation without departing from the spirit of the invention.

What is claimed is:

1. A method of running a printed circuit board (PCB) trace on a PCB comprising a plurality of PCB layers, the method comprising:
   forming a plurality of conductive trace segments on at least one of the plurality of PCB layers;
   forming a capacitor formed on at least one of the plurality of PCB layers;
   forming a conductive material formed within a first via extending through two or more of the plurality of PCB layers; and
   forming a conductive path between the capacitor and the conductive material by connecting one or more of the plurality of conductive trace segments; and
   configurably setting a predetermined impedance to the conductive path by electrically connecting one or more segments of the plurality of conductive trace segments within the conductive path or electrically disconnecting one or more segments of the plurality of conductive trace segments from the conductive path.

2. The method of claim 1, the method further comprising: selectively cutting at least one of the plurality of trace segments to form the conductive path.

3. The method of claim 1, the method further comprising: selectively electrically connecting two or more of a plurality of disconnected trace segments to form the conductive path.

4. The method of claim 1, the method further comprising: electrically connecting two or more locations on the conductive path with a bridge.

5. The method of claim 4, the method further comprising: cutting a portion of the conductive path.

6. The method of claim 1, the method further comprising: forming a second via extending through two or more of the plurality of PCB layers, wherein, when current flows through the first via and the second via, the first via has a first electrical field with a first polarity and the second via has a second electrical field with a second polarity opposite the first polarity, such that the electrical first electrical field and the second electrical field cancel each other out.

7. The method of claim 1, the method further comprising: forming a second via extending through two or more of the plurality of PCB layers between 0.2 mm and 4 mm from the first via in a plan view.

8. The method of claim 1, wherein the plurality of trace segments comprise a first plurality of trace segments extending in a first direction and a second plurality of trace segments extending in a second direction, wherein the first direction is orthogonal to the second direction.

9. The method of claim 8, wherein the method further comprises:
   connecting a first segment from the first plurality of trace segments to a second segment from the second plurality segments, wherein the first segment and the second segment are within the conductive path.

10. A printed circuit board (PCB), comprising:
    a plurality of PCB layers;
    a plurality of conductive trace segments formed on a PCB layer of the plurality of PCB layers;
    a capacitor formed on at least one PCB layer of the plurality of layers;
    a conductive path comprising one or more of the plurality of conductive trace segments, wherein a length of the conductive path of the conductive trace is configurably settable to a predetermined impedance by electrically connecting one or more segments of the plurality of conductive trace segments within the conductive path or electrically disconnecting one or more segments of the plurality of conductive trace segments from the conductive path.

11. The PCB of claim 10, the PCB further comprising: one or more disconnected trace segments that are not connected to form the conductive path.

12. The PCB of claim 10, the PCB further comprising:
a first via extending through the plurality of PCB layers; and
a second via extending through two or more of the plurality of PCB layers, wherein, when current flows through the first via and the second via, the first via has a first electrical field with a first polarity and the second via has a second electrical field with a second polarity opposite the first polarity, such that the electrical first electrical field and the second electrical field cancel each other out.

13. The PCB of claim 10, wherein the PCB comprises:
a first via extending through the plurality of PCB layers;
a second via extending through two or more of the plurality of PCB layers, wherein the second via is between 0.2 mm to 4 mm away from the first via in a plan view.

14. The PCB of claim 10, the PCB wherein the conductive path further comprises a bridge electrically connecting two or more locations of the conductive trace.

15. The PCB of claim 10, wherein the plurality of trace segments comprise a first plurality of trace segments extending in a first direction and a second plurality of trace segments extending in a second direction, wherein the first direction is orthogonal to the second direction.

16. The PCB of claim 15, wherein a first segment from the first plurality of trace segments is connected to a second segment from the second plurality segments, wherein the first segment and the second segment are within the conductive path.

\* \* \* \* \*